United States Patent [19]

Bridges et al.

[11] Patent Number: 5,291,076
[45] Date of Patent: Mar. 1, 1994

[54] DECODER/COMPARATOR AND METHOD OF OPERATION

[75] Inventors: Jeffrey T. Bridges; Jeffrey E. Maguire; Paul C. Rossbach, all of Austin, Tex.

[73] Assignee: Motorola, Inc., Schaumburg, Ill.

[21] Appl. No.: 937,018

[22] Filed: Aug. 31, 1992

[51] Int. Cl.$^5$ ............... H03K 19/0948; H03K 19/096
[52] U.S. Cl. .................... 307/449; 307/452; 307/481
[58] Field of Search ............ 307/452, 449, 443, 480, 307/475, 481

[56] References Cited

U.S. PATENT DOCUMENTS

| | | | |
|---|---|---|---|
| 4,086,500 | 4/1978 | Suzuki et al. | 307/449 |
| 4,401,903 | 8/1983 | Iizuka | 307/449 |
| 4,567,581 | 1/1986 | Dumbri et al. | 307/449 |
| 5,015,882 | 5/1991 | Houston et al. | 307/452 |
| 5,065,048 | 11/1991 | Asai et al. | 307/542 |

Primary Examiner—Edward P. Westin
Assistant Examiner—Benjamin D. Driscoll
Attorney, Agent, or Firm—Lee E. Chastain

[57] ABSTRACT

A precharge device (28) has a first (30) and a second node (32), a transistor tree (29), a screening transistor (Q20) and clocking circuitry (Q17, Q18, Q19). The transistor tree (29) couples the first (30) and the second (32) node and is operable to electrically short-circuit the nodes according to input signals ($A_1$, $A_2$, $A_3$). The screening transistor (Q20) has a first and a second [source-drain region] current electrode and a [gate] control electrode. The first [source-drain region] current electrode is coupled to a third node (34), the second [source-drain region] current electrode is coupled to the second node (32) and the [gate] control electrode is coupled to the first node (30). The clocking circuitry alternately precharges the first (30) and third nodes (34) to a first known voltage level and evaluates the voltage on the first node (30) to output a logic level.

15 Claims, 3 Drawing Sheets

DECODER/COMPARATOR AND METHOD OF OPERATION

FIELD OF THE INVENTION

The present invention generally relates to digital computing systems, and more specifically to precharge devices.

BACKGROUND OF THE INVENTION

Precharge devices are synchronous logic circuits that generate an output depending upon a predetermined combination of inputs. Precharge devices are characterized by two states, precharge and evaluate. In the precharge state, a node is charged to a known or predetermined voltage level. In the evaluate state, an array or "tree" of transistors is given the opportunity to discharge the node to a second known or predetermined voltage level or to allow the charge to persist. Each input signal is connected, typically, to a gate of one or more of the transistors in the tree. The final charge on the node may thereby be controlled by the particular values of the inputs and the way in which the transistors are connected within the tree. The final voltage at the node, high or low, acts as the output of the precharge device after being suitably buffered and, perhaps, inverted. The two states of a precharge device each correspond to one of the two logic states of a clock signal cycle to which the precharge device is synchronized. Typically, a precharge device precharges the node when the clock is low and evaluates the node when the clock is high.

Two common uses for precharge devices are as decoders and as comparators. Decoders output a unique signal if and only if all of the bits of an input match a predetermined set of values. A decoder may thereby enable a particular write line in a matrix of memory cells if and only if an input memory address matches the predetermined address of a line of memory cells to which the decoder is connected. Similarly, a comparator will output a unique signal if and only if two inputs, each containing multiple data bits, are identical.

The particular way the inputs are combined within the tree of a precharge device determines the particular operating characteristics and, hence, the particular name of the precharge device. As described above, if the tree discharges the charged node if and only if the input bits match a single set of predetermined values, then the precharge device is a decoder. Any Boolean function can be implemented as a precharge device by constructing the tree such that the tree causes the precharge device to discharge when the Boolean function is either true or false, as needed by the designer. Logically, it is irrelevant whether a tree allows the charge in a precharge device to persist when the Boolean function is true or to persist when the function is false.

Each precharge device can be implemented in one of two logically equivalent ways. The two implementations correspond to a tree that discharges the charged node when the Boolean fucntion is true and to a tree that discharges the charged node when the Boolean function is false. When the precharge device discharges the node if the Boolean function is true, it is said to "evaluate to the active state." When the precharge device discharges the node if the Boolean function is false, it is said to "evaluate to the inactive state." One of these implementations uses its inputs directly connected in a manner to describe a particular function. The second implementation uses the complements of the inputs and a second function. DeMorgan's law allows the designer to restructure the tree of the first function to produce a tree for the second function. The second function is the first function's complement.

Although logically equivalent, each of the two possible implementations of a precharge device has its own disadvantage. Specifically, the more transistors connected in series within the tree, the slower the performance of the precharge device. This disadvantage is typically associated with a precharge device that discharges the charged node when its function is true. Conversely, a precharge device that evaluates to the inactive state generates an output unacceptable to many types of circuits. This disadvantage is typically associated with a precharge device that discharges the charged node when its function is false.

SUMMARY OF THE INVENTION

In accordance with the present invention, there is disclosed a unitransitional precharge device and method of operation which substantially eliminates disadvantages of prior precharge devices.

A precharge device has a first and a second node, a transistor tree, a screening transistor and clocking circuitry. The transistor tree couples the first and the second nodes and is operable to electrically short-circuit the nodes according to input signals. The screening transistor has a first and a second current electrode and a control electrode. The first current electrode is coupled to a third node, the second current electrode is coupled to the second node and the control electrode is coupled to the first node. The clocking circuitry alternately precharges the first and third nodes to a first known voltage level and evaluates the voltage on the first node to output a logic level.

A method of decoding a plurality of inputs is also described comprising the steps of precharging a first and a second node to a first known voltage at a first time and evaluating the voltage on the first node at a second time. The first node and a third node are coupled to a transistor tree. The tree is operable to electrically short-circuit the two nodes responsive to input signals. The second node is coupled to a first current electrode of a screening transistor. The screening transistor also has a second current electrode and a control electrode. The control electrode of the screening transistor is coupled to the first node and the second current electrode of the screening transistor is coupled to the third node.

BRIEF DESCRIPTION OF THE DRAWINGS

The features and advantages of the present invention will be more clearly understood from the following detailed description taken in conjunction with the accompanying Figures where like numerals refer to like and corresponding parts and in which.

DETAILED DESCRIPTION OF A PREFERRED EMBODIMENT

The tree within a precharge device designed as a decoder is illustrative of the design compromise necessitated by selecting one tree implementation over the other. A decoder tree is either designed as NAND gate or as NOR gate. These implementations are dictated by two design goals. First, a decoder tree must generate a certain output signal given only one combination of input bits. Second, all precharge devices must trigger only when the Boolean function embodied by their respective tree is true, the "selected state." Both the logical operators NAND and NOR generate a certain output signal in only one circumstance. The output of a NAND gate is low and therefore discharges the charged node only when all of its inputs are high. Otherwise its output is high. The selected state of a decoder implemented as a NAND gate is, therefore, (1, 1, 1, etc.). The output of a NOR gate is high and therefore allows the charged node to persist only when all of its inputs are low. Otherwise its output is low. The selected state of a decoder implemented as a NOR gate is, therefore, (0, 0, 0, etc.).

Figure 1:
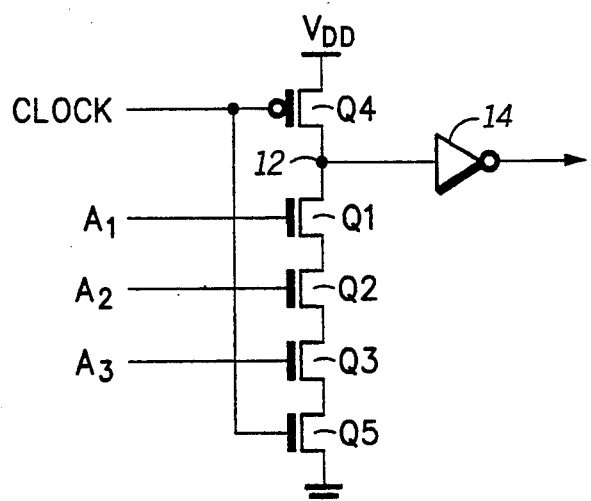
FIG. 1 depicts a partial schematic diagram of a decoder known in the art implemented as a NAND gate.

FIG. 1 depicts a partial schematic diagram of a decoder 10 known in the art implemented as a NAND gate. Decoder 10 has a node 12 to which three decode transistors, Q1, Q2, and Q3 are connected in series. Decode transistors Q1, Q2 and Q3 make-up the transistor tree of decoder 10 (hereinafter simply "tree"). The arrangement of the decode transistors within the tree determines whether decoder 10 is implemented as a NAND gate (discharges when the Boolean function is true) or as a NOR gate (discharges when the Boolean function is false). The gates of transistors Q1, Q2, and Q3 are connected to the input signals $A_1$, $A_2$ and $A_3$, respectively. The drain of transistor Q1 is connected to node 12. The source of decode transistor Q1 is connected to the drain of decode transistor Q2. The source of decode transistor Q2 is connected to the drain of decode transistor Q3. Decoder 10 also comprises a clocking transistor Q4 and an evaluate transistor Q5. The gates of both of these transistors are connected to a periodic clocking signal, CLOCK. The drain of clocking transistor Q4 is connected to a voltage supply, $V_{DD}$. The source of clocking transistor Q4 is connected to node 12. Evaluate transistor Q5 has its drain and source connected to the source of decode transistor Q3 and to ground, respectively. The output of decoder 10 is generated by the voltage at node 12 inverted and buffered by an inverter 14. As depicted, all transistors in decoder 10 are n-channel devices with the exception of clocking transistor Q4. Clocking transistor Q4 is a p-channel device.

In operation, decoder 10 precharges node 12 to $V_{DD}$ when the input CLOCK is low. When the input CLOCK is high, precharge device 10 evaluates the voltage present on node 12. The three decode transistors then have the opportunity to electrically short-circuit node 12 to ground if and only if all three inputs $A_1$, $A_2$, and $A_3$ are high. If any of the inputs $A_1$, $A_2$, or $A_3$ is low, then node 12 will remain charged and high.

As depicted, decoder 10 is particularly designed to trigger when all inputs are high. It may be described as a decoder which triggers only on (111). Decoder 10 can be designed to generate its unique output when its inputs are mixed, (001), (010), (011), etc., in the selected state. In such a mixed input case, the inputs that are low in the selected state are inverted high before being input into the decoder. For instance, if the designer desires that decoder 10 trigger when $A_1$ and $A_2$ are high and when $A_3$ is low, then input $A_3$ is first inverted before it reaches decode transistor Q3. Typically this is a trivial modification because designers route both a signal and its inverse throughout a circuit such as a data processor.

Decoder 10 as depicted in FIG. 1 has at least one disadvantage. Node 12 must discharge through each of the decode transistors Q1, Q2 and Q3. Decoder 10 typically has many more control signals and thus more decode transistors than the three depicted. Each decode transistor adds a small propagation delay to the discharge of node 12. The cumulative effect of this delay is to limit decoder 10 and precharge devices similarly designed to applications in which speed in not particularly critical, to applications with few control signals or both.

Figure 2:
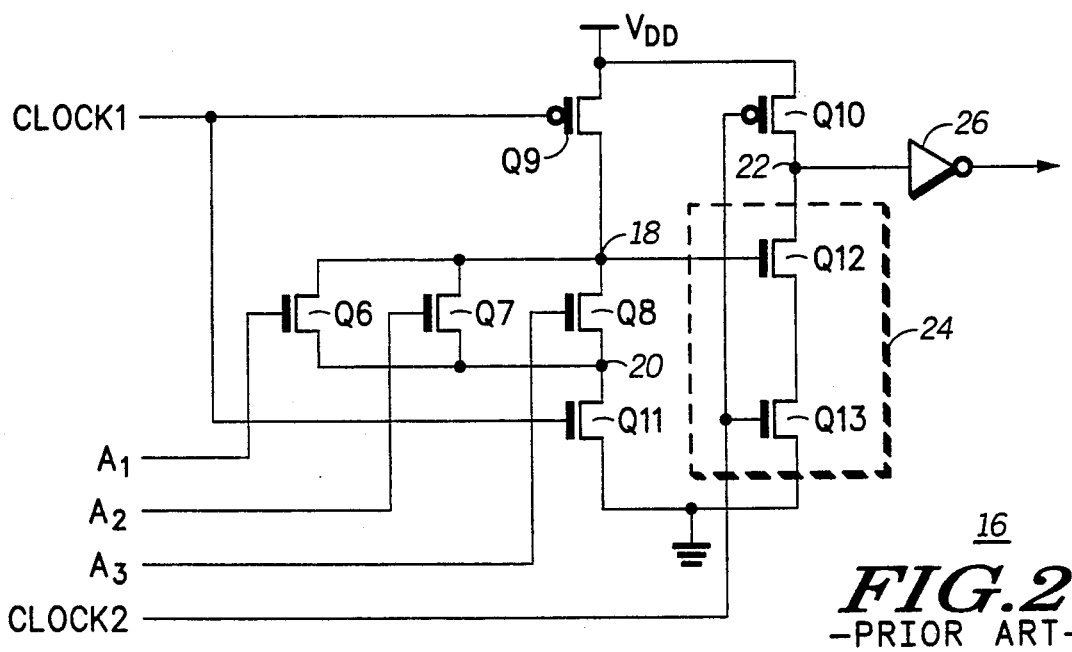
FIG. 2 depicts a partial schematic diagram of a decoder known in the art implemented as a NOR gate.

FIG. 2 depicts a partial schematic diagram of a decoder 16 known in the art implemented as a NOR gate. Decoder 16 has two nodes 18 and 20 to which three decode transistors, Q6, Q7, and Q8 are connected in parallel. Decode transistors Q6, Q7, and Q8 make-up the tree of decoder 16. The gates of transistors Q6, Q7, and Q8 are connected to the input signals $A_1$, $A_2$ and $A_3$, respectively. The drains of transistors Q6, Q7 and Q8 are connected to node 18. The sources of transistors Q6, Q7, and Q8 are connected to node 20.

Decoder 16 also has two clocking transistors Q9 and Q10 and an evaluate transistor Q11. The gates of transistors Q9 and Q11 are connected to a first periodic clocking signal, CLOCK1. The gate of clocking transistor Q10 is connected to a second periodic clocking signal CLOCK2. The drains of clocking transistors Q9 and Q10 are connected to a voltage supply, $V_{DD}$. The source of clocking transistor Q9 is connected to node 18. The source of clocking transistor Q10 is connected to an output node 22. Evaluate transistor Q11 has its drain and source connected to node 20 and to ground, respectively. The voltage at node 18 is screened from any device connected to decoder 16 by a two input NAND gate 24. NAND gate 24 has as its second input a second timing signal, CLOCK2. The output of NAND gate 24 is connected to output node 22.

NAND gate 24 itself has two transistors Q12 and Q13. The gate of each of transistors Q12 and Q13 is connected to an input of NAND gate 24. Here, node 18 is connected to the gate of transistor Q12 and the signal CLOCK2 is connected to the gate to transistor Q13. The drain of transistor Q12 is connected to output node 22 and acts as the output of NAND gate 24. The source of transistor Q12 is connected to the drain of transistor Q13. The source of transistor Q13 is connected to ground. The output of decoder 16 is generated by the voltage at node 22 inverted and buffered by an inverter 26. As depicted, all transistors in decoder 16 are n-channel devices with the exception of clocking transistors Q9 and Q10. Clocking transistors Q9 and Q10 are p-channel devices.

In practice, decoder 16 has more than three input signals, $A_1$, $A_2$, and $A_3$. N inputs may be connected to the gates of N decode transistors (where N is an integer). Each of the N decode transistors is connected in parallel between nodes 18 and 20 to provide a more practical decoder.

In operation, decoder 16 precharges nodes 18 and 22 to $V_{DD}$ when the inputs CLOCK1 and CLOCK2 are low. When the input CLOCK1 is high, decoder 16 evaluates the voltage present on node 18. The three decode transistors then have the opportunity to electrically short-circuit node 18 to ground through transistor Q11 if any of the three inputs $A_1$, $A_2$, and $A_3$ are high. If and only if all of the inputs $A_1$, $A_2$, and $A_3$ are low, will node 18 remain charged high. Decoder 16, therefore, "evaluates to the inactive state." The voltage at node 18 changes or discharges in every case except in the selected state. This undesired transition is screened from any device connected to the output of decoder 16 by clocking transistor Q10 and NAND gate 24. NAND gate 24 only discharges output node 22 when node 18 and CLOCK2 are both high. This corresponds to the selected state when all inputs, $A_1$, $A_2$, and $A_3$ are low. In every other case, node 18 has no effect on node 22. Node 22 therefore remains high.

As depicted, decoder 16 is particularly designed to generate a unique output when all of its inputs $A_1$, $A_2$, and $A_3$ are low. It may be described as a decoder which triggers only on (000). As described in connection with FIG. 1, decoder 16 can be designed to generate its unique output when its inputs are mixed by connecting the gates of transistors Q6, Q7 and Q8 to the input signals, $A_1$, $A_2$, and $A_3$, or their inverses as appropriate.

Decoder 16 has a least one disadvantage. To make decoder 16 suitable for use with other devices, its evaluation to the inactive state must be screened from the other devices. here, NAND gate 24 screens the output of decoder 16. NAND gate 24, however, must be driven with a suitable second timing signal. This timing signal may be either a second clock signal or the output of a "dummy row" of transistors. Decoder, with either a second clock signal or a dummy row of transistors, requires additional circuitry. This additional circuitry requires more layout space and imposes a speed penalty on the performance of decoder 16.

If the timing signal is a second clock signal, then it is asymmetric, is active during the evaluate state and has a shorter duty cycle than the first clock signal. The beginning of the active portion of the second clock signal is delayed a certain time into the evaluate state to allow the voltage on node 18 to settle.

If the timing signal is generated by a dummy row of parallel transistors, then the dummy row is designed to generate an active signal no faster than the decoder's slowest transition in the evaluate state. The slowest transition in the evaluate state occurs when node 18 discharges to ground through a single conducting decode transistor. The speed limitation may be met by driving the second input of NAND gate 24 with the output of a second precharge device. This second precharge device lacks NAND gate 24, clocking transistor Q10 and inverter 26 but is otherwise identical to decoder 16. The tree of transistors in the second precharge device has the same size and number of decode transistors as has decoder 16, here three. The second precharge device precharges and evaluates node 18 as described in connection with decoder 16. All of the gates of the tree transistors, however, are connected to ground except one. It is connected to a positive voltage supply, $V_{DD}$. Hence, the row of decode transistors forming the tree is a "dummy" row because it decodes no actual data. The output of the second precharge device will always discharge to ground in the evaluate state. However, the charge on the first node within the precharge device can only discharge through a single transistor, the transistor whose gate is connected to $V_{DD}$. This will ensure that the second precharge device outputs an active signal for NAND gate 24 after or simultaneously with the discharge of node 18.

Figure 3:
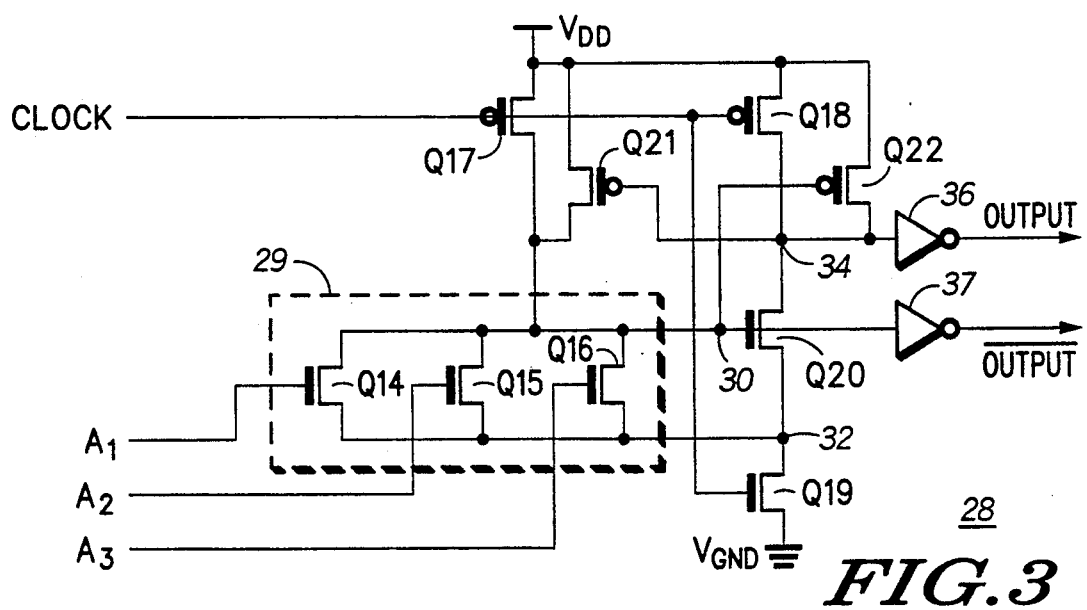
FIG. 3 depicts a partial schematic diagram of a precharge device constructed according to the disclosed invention.

FIG. 3 depicts a partial schematic diagram of a precharge device 28 constructed according to the disclosed invention. Precharge device 28 is implemented as a NOR gate. Precharge device 28, therefore, evaluates to the active state. This design allows precharge device 28 to have a large number of input signals without reducing its performance. Precharge device 28, however, has only a single timing signal, CLOCK. Precharge device 28 does not need a second clock or the output from a dummy row of transistors as do prior precharge devices designed as NOR gates.

Precharge device 28 has a transistor tree 29 and two nodes 30 and 32. Tree 29 is connected between nodes 30 and 32 and contains logic circuits operable to electrically short-circuit nodes 30 and 32 together given a predetermined set of inputs as will be described below. In this first embodiment, tree 29 contains three decode transistors Q14, Q15, and Q16 connected in parallel between nodes 30 and 32. The gates of transistors Q14, Q15 and Q16 are connected to the input signals $A_1$, $A_2$ and $A_3$, respectively. The drains of transistors Q14, Q15, and Q16 are connected to node 30. The sources of transistors Q14, Q15, and Q16 are connected to node 32.

Precharge device 28 also has two clocking transistors Q17 and Q18, an evaluate transistor Q19 and a screening transistor Q20. The gates of clocking transistors Q17 and Q18 and evaluate transistor Q19 are connected to a periodic timing signal, CLOCK. The drains of clocking transistors Q17 and Q18 are connected to a voltage supply. $V_{DD}$. The source of clocking transistor Q17 is connected to node 30. The source of clocking transistor Q18 is connected to an output node 34. Evaluate transistor Q19 has its drain and source connected to node 32 and to ground, respectively. Screening transistor Q20 has its gate connected to node 30, its drain connected to output node 34 and its source connected to node 32.

Precharge device 28 may have two latching transistors Q21 and Q22 to improve the resistance of precharge device 28 to inherent circuit instabilities. Both of the drains of latching transistors Q21 and Q22 are connected to $V_{DD}$. The source and gate of latching transistor Q21 are connected to nodes 30 and 34, respectively. Conversely, the source and gate of latching transistor Q22 are connected to nodes 34 and 30, respectively.

The output of precharge device 28, OUTPUT, is generated by the voltage at node 34 inverted and buffered by an inverter 36. An inverter 37 connected to node 30 generates the signal $\overline{\text{OUTPUT}}$. As depicted, all transistors in precharge device 28 are n-channel devices with the exception of clocking transistors Q17 and Q18 and latching transistors Q21 and Q22. Clocking transistors Q17 and Q18 and latching transistors Q21 and Q22 are p-channel devices.

Figure 4:
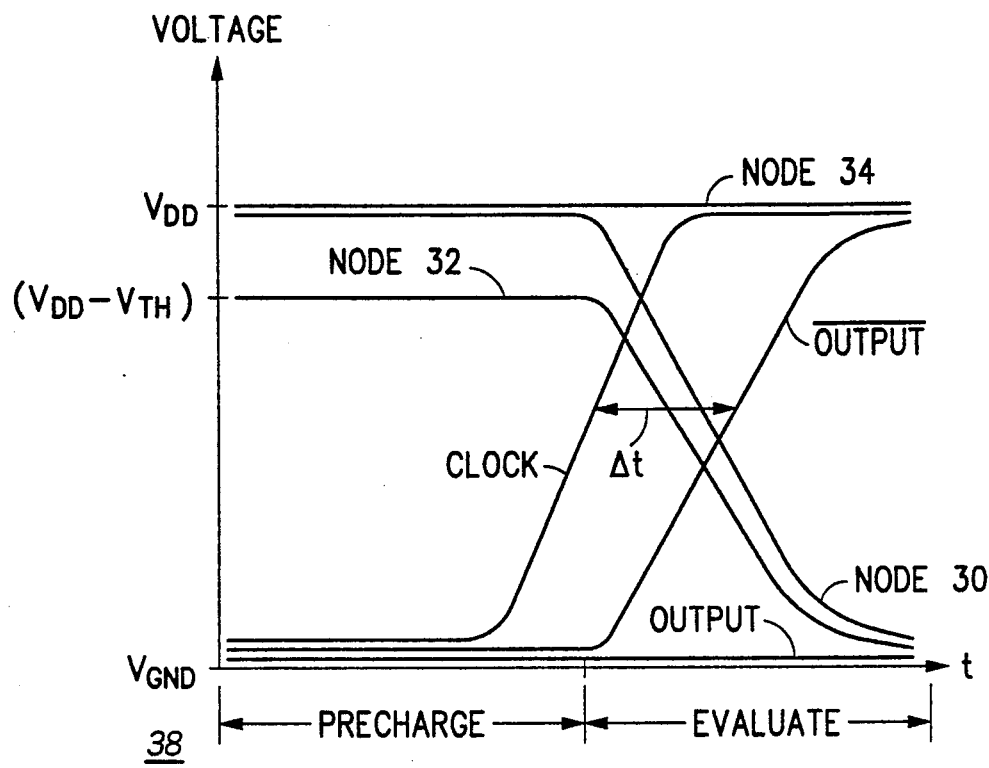
FIG. 4 depicts a timing diagram in graphical form of the precharge device depicted in FIG. 3 in an unselected state.

FIG. 4 depicts a timing diagram 38 in graphical form of the precharge device 28 depicted in FIG. 3 in the unselected state. The unselected state of precharge device 28 is the combination of inputs that makes the Boolean function false. The unselected state of a precharge device implemented as a NOR gate is every combination of inputs, $A_1$, $A_2$, and $A_3$ that discharge node 30. Node 30 is discharged if any of the inputs $A_1$, $A_2$, and $A_3$ are a logic high. Precharge device 28 may be described as a decoder that triggers only on (000). However, one skilled in the art will readily appreciate the wide variety of applications for precharge device 28 with suitably modified transistor trees. In any of the unselected states, decoder 28 outputs a logic low signal through inverter 36. FIG. 4 depicts the voltages at nodes 30, 32, 34 (labeled NODE 30, NODE 32, and NODE 34, respectively) and at the output of inverters 36 and 37 (labeled OUTPUT and $\overline{\text{OUTPUT}}$, respectively) with respect to the input CLOCK (labeled CLOCK). FIG. 4 is divided into two halves named after and corresponding to the two states of precharge device 28, precharge and evaluate. In the depicted embodiment, the precharge and evaluate states correspond to a low and a high voltage on CLOCK, respectively.

In operation, precharge device 28 precharges nodes 30 and 34 to a known or predetermined voltage level when the input CLOCK is low. In the illustrated form, nodes 30 and 34 are precharged to $V_{DD}$. The output from inverters 36 and 37 are therefore initially low. Transistor Q20 causes a voltage drop between nodes 34 and 32 of $V_{TH}$, one transistor threshold voltage. Node 32 is therefore initially at a voltage of $(V_{DD}-V_{TH})$. When the input CLOCK switches high, precharge device 28 evaluates the voltage present on node 30. In the unselected state, the voltage at node 30 is always discharged to a second known or predetermined voltage level through clocking transistor Q19. In the illustrated form, node 30 is discharged to ground, $V_{GND}$. The voltage on node 32 also drops to ground as the input CLOCK places clocking transistor Q19 in a conducting state. As the voltage on node 30 drops, screening transistor Q20 ceases to conduct. The non conducting state of screening transistor Q20 prevents node 34 from discharging, maintaining the low output from inverter 36. The low voltage level on node 30, however, causes $\overline{\text{OUTPUT}}$ to switch to high.

Figure 5:
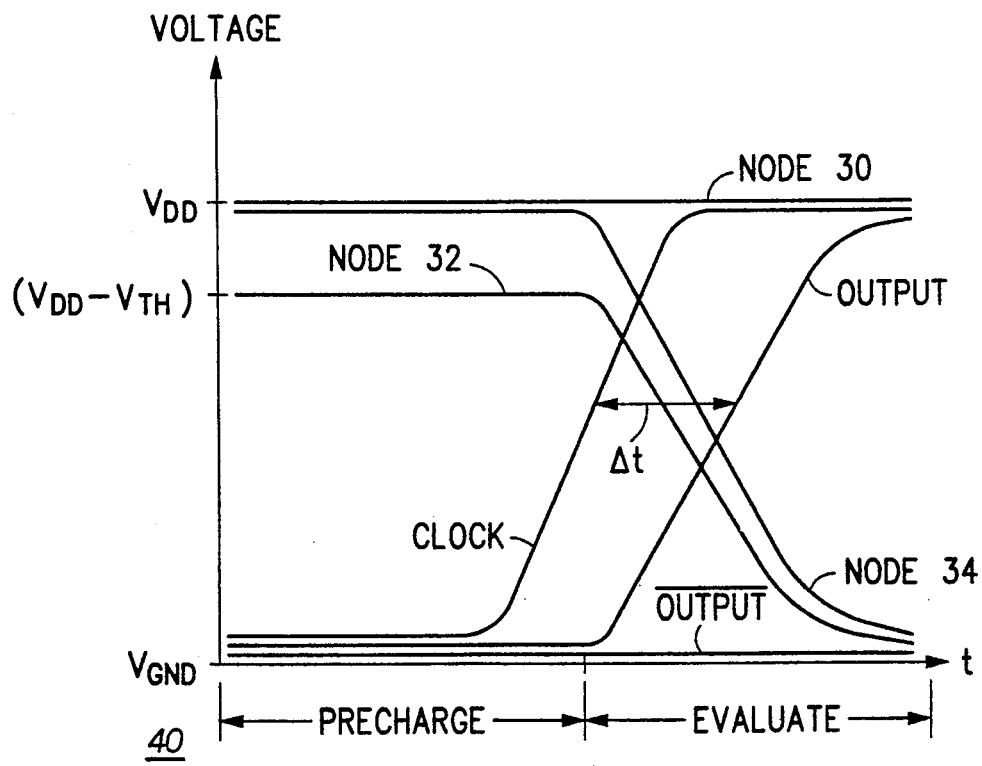
FIG. 5 depicts a timing diagram in graphical form of the precharge device depicted in FIG. 3 in a selected state.

FIG. 5 depicts a timing diagram in graphical form of the precharge device 28 depicted in FIG. 3 in the selected state. The selected state of precharge device 28 is the combination of inputs that makes the Boolean function true. The selected state of a precharge device implemented as a NOR gate is the combination of inputs, $A_1$, $A_2$, and $A_3$ that does not discharge node 30. Node 30 remains in its precharged state only if all of the inputs $A_1$, $A_2$, and $A_3$ are a logic low. In the selected state, precharge device 28 outputs a logic high signal through inverter 36. FIG. 5 depicts the voltages at nodes 30, 32, 34 (labeled NODE 30, NODE 32, and NODE 34, respectively) and at the output of inverters 36 and 37 (labeled OUTPUT and $\overline{\text{OUTPUT}}$, respectively) with respect to the input CLOCK (labeled CLOCK). FIG. 5 is divided into two halves named after and corresponding to the two states of decoder 28, precharge and evaluate. In the depicted embodiment, the precharge and evaluate states correspond to a low and a high voltage on CLOCK, respectively.

As described above, precharge device 28 precharges nodes 30 and 34 to $V_{DD}$, precharges node 32 to $(V_{DD}-V_{TH})$ and outputs a logic low on inverters 36 and 37 when the input CLOCK is low. When the input CLOCK switches high, decoder 28 evaluates the voltage present on node 30. In the selected state, the voltage at node 30 is not discharged to ground. A high voltage on node 30 places screening transistor Q20 in a conducting state. Evaluate transistor Q19 is placed in a conducting state by a high CLOCK signal. Node 34 then discharges to ground through screening transistor Q20 and evaluate transistor Q19. Inverter 36 inverts the low voltage on node 34 and outputs a high logic level. Inverter 37 inverts the high voltage at node 30 and continues to output a low logic signal. Node 32 discharges to ground as described above in connection with FIG. 4.

Referring to FIG. 4 and FIG. 5, the response time for decoder 28 is labeled as $\Delta t$ and is measured from half the full scale deflection of the input CLOCK to half the full scale deflection of $\overline{\text{OUTPUT}}$ or OUTPUT in the unselected or selected state, respectively. A comparable decoder implemented as a NAND gate (See FIG. 1) has a significantly longer response time, typically twice as long as a NOR decoder constructed in accordance with the present invention. The particular savings in response time is, as known in the art, a function of several variables including the number of inputs to tree 29.

FIG. 4 and FIG. 5 demonstrate how precharge device 28 is "uni-transitional." Precharge device 28 is uni-transitional because the output of inverter 36 changes only in the selected state. In particular, the output of inverter 36 remains low in all of the unselected states and only switches high in the selected state or states. The uni-transitional to active state nature of precharge device 28 allows either of its outputs to drive another device where the second device is synchronized to the same clocking signal as is precharge device 28. If, instead, precharge device 28 "evaluated to the inactive state" as does decoder 16 depicted in FIG. 2, then a circuit connected to the output of precharge device 28 would have to be shielded from the extra transition of the output in the unselected state or states. The output of such a decoder could be shielded with a NAND gate and a second clocking signal as described in connection with FIG. 2.

In both the unselected state and the selected state, optional latching transistors Q21 and Q22 ensure that the output of decoder 28 is reliable despite fluctuations in transistor performance due to inherent circuit instabilities. Both latching transistors Q21 and Q22 are placed into a non-conducting state during the precharge state. In the evaluate state, one of the two latching transistors Q21 and Q22 improves the performance of decoder 28 in each of the unselected and the selected states.

In the unselected state, one or more of decode transistors Q14, Q15 or Q16 discharge node 30 to ground. As node 30 discharges, it places latching transistor Q22 into a conducting state. Latching transistor Q22 then supplies a voltage, $V_{DD}$, to node 34. Latching transistor Q22 ensures that node 34 is high in the unselected state even if evaluate transistor Q19 turns on too quickly or screening transistor Q20 turns off too slowly. Either of these two events would cause node 34 to discharge slightly. If node 34 discharged below a certain threshold, inverter 36 would erroneously treat the voltage at node 34 as a logic low.

Conversely, in the selected state, none of decode transistors Q14, Q15 or Q16 discharge node 30 to ground. Node 34, however, discharges to ground as evaluate transistor Q19 switches on in the evaluate state. As node 34 discharges, it places latching transistor Q21 into a conducting state. Latching transistor Q21 then supplies a voltage, $V_{DD}$, to node 30. Latching transistor Q21 thereby reduces the impact of any noise at node 30 on the voltage level at node 30.

In the preferred embodiment, precharge device 28 is designed with transistors having particular gate widths. The widths are selected following three design guidelines. First, the size of decode transistors Q14, Q15 and Q16 are minimized to reduce space needed to layout decoder 28 and to reduce the loading on inputs $A_1$, $A_2$, and $A_3$ and on node 30. Second, screening transistor Q20 should be large enough to pull down node 34. Third, the size of evaluate transistor Q19 should be smaller than or equal to the size of screening transistor Q20.

Figure 6:
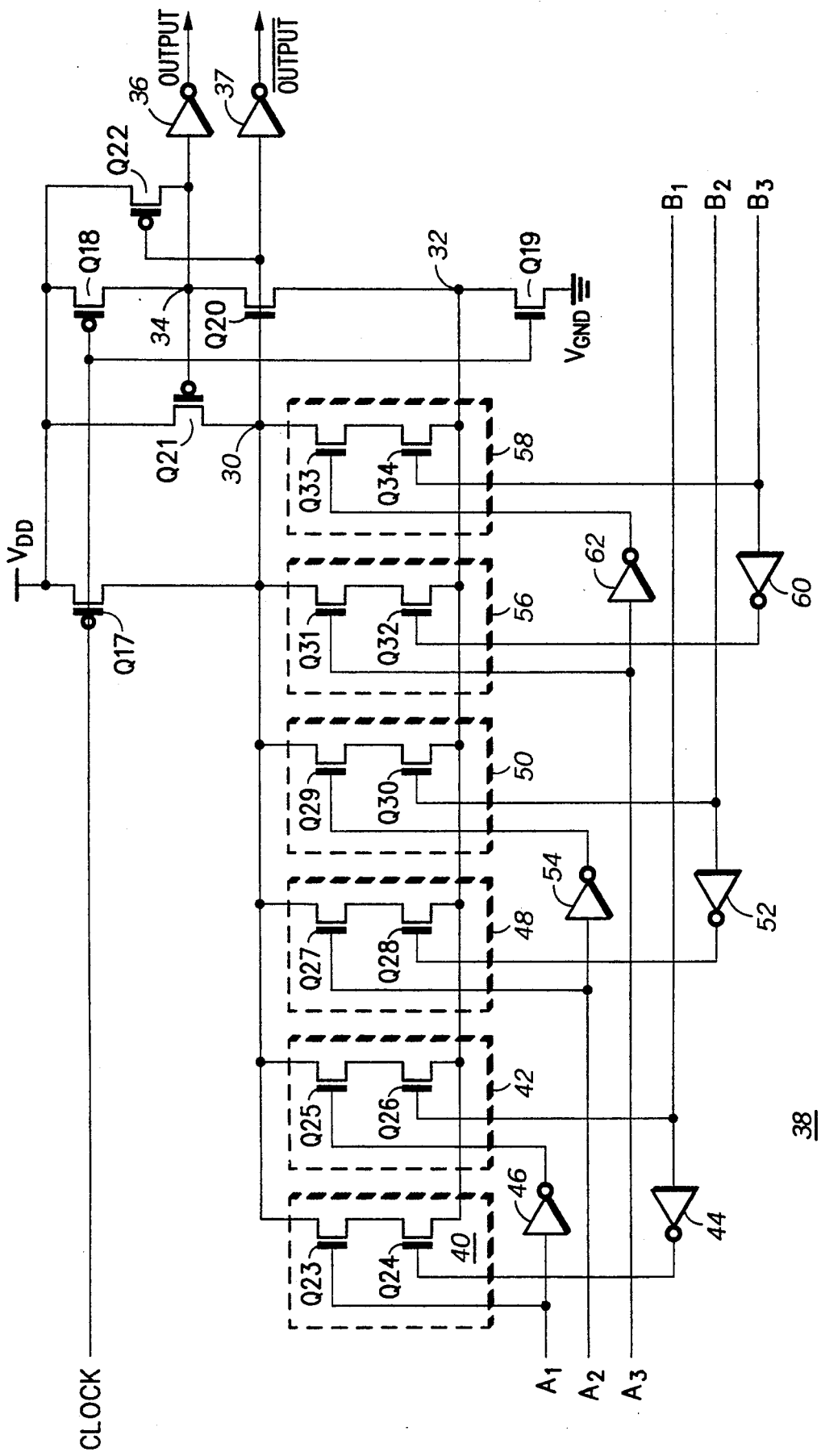
FIG. 6 depicts a partial schematic diagram of a comparator incorporating the invention depicted in FIG. 3.

As depicted in FIG. 3, precharge device 28 is particularly designed to generate a unique output when all of its inputs $A_1$, $A_2$, and $A_3$ are low. As described in connection with FIG. 1, FIG. 2, FIG. 4 and FIG. 5 precharge device 28 can be designed to trigger when its inputs are mixed, with more or less than three inputs and in response to more than one selected state. A greater-than comparator, for instance, triggers in all cases in which its input is greater than a predetermined value. In general, tree 29 of precharge device 28 can be designed to implement any Boolean function. FIG. 6, described immediately below, depicts a precharge device designed to implement a different function and, hence, trigger on a different set of inputs.

FIG. 6 depicts a partial schematic diagram of a comparator 38 incorporating the invention depicted in FIG. 3. Comparator 38 is a particular type of precharge device. Comparator 38 compares two three-bit digital inputs, $A_1$, $A_2$, and $A_3$ and $B_1$, $B_2$, and $B_3$ and outputs a logic one if each pair of corresponding input bits is identical, e.e. $A_1 = B_1$, $A_2 = B_2$, $A_3 = B_3$, etc. Otherwise, the output of comparator 38 is a logic zero. The output of comparator 38 is synchronized with the input CLOCK as is the output of precharge device 28.

Comparator 38 is constructed as is decoder 28 depicted in FIG. 3 with the exception of decode transistors Q14, Q15 and Q16. These three decode transistors are each replaced with two parallel circuit pathways between nodes 30 and 32. Each of the parallel circuit pathways has two compare transistors connected in series. The gates of the two compare transistors are connected to the inputs or their inverses as described below such that nodes 30 and 32 will electrically short-circuit together unless the two inputs $A_1$, $A_2$, and $A_3$ and $B_1$, $B_2$, and $B_3$ are identical. If nodes 30 and 32 electrically short-circuit together, node 30 will discharge to ground and output a logic low from inverter 36 as described in connection with FIG. 3 through FIG. 5.

Circuit pathways 40 and 42 replace decode transistor Q14 from FIG. 3. As described above, circuit pathways 40 and 42 are connected in parallel between nodes 30 and 32. Circuit pathway 40 has two compare transistors Q23 and Q24. The drain of compare transistor Q23 is connected to node 30. The source of compare transistor Q23 is connected to the drain of compare transistor Q24. The source of compare transistor Q24 is connected to node 32. The gate of compare transistor Q23 is connected to the input $A_1$. The gate of compare transistor Q24 is connected to the input $B_1$ inverted by an inverter 44. Circuit pathway 42 has two compare transistors Q25 and Q26. The drain of compare transistor Q25 is connected to node 30. The source of compare transistor Q25 is connected to the drain of compare transistor Q26. The source of compare transistor Q26 is connected to node 32. The gate of compare transistor Q25 is connected to the input $A_1$ inverted by an inverter 46. The gate of compare transistor Q26 is connected to the input $B_1$.

Circuit pathways 48 and 50 replace decode transistor Q15 from FIG. 3. As described above, circuit pathways 48 and 50 are connected in parallel between nodes 30 and 32. Circuit pathway 48 has two compare transistors Q27 and Q28. The drain of compare transistor Q27 is connected to node 30. The source of compare transistor Q27 is connected to the drain of compare transistor Q28. The source of compare transistor Q28 is connected to node 32. The gate of compare transistor Q27 is connected to the input $A_2$. The gate of compare transistor Q28 is connected to the input $B_2$ inverted by an inverter 52. Circuit pathway 50 has two compare transistors Q29 and Q30. The drain of compare transistor Q29 is connected to node 30. The source of compare transistor Q29 is connected to the drain of compare transistor Q30. The source of compare transistor Q30 is connected to node 32. The gate of compare transistor Q29 is connected to the input $A_2$ inverted by an inverter 54. The gate of compare transistor Q30 is connected to the input $B_2$.

Circuit pathways 56 and 58 replace decode transistor Q16 from FIG. 3. As described above, circuit pathways 56 and 58 are connected in parallel between nodes 30 and 32. Circuit pathway 56 has two compare transistors Q31 and Q32. The drain of compare transistor Q31 is connected to node 30. The source of compare transistor Q31 is connected to the drain of compare transistor Q32. The source of compare transistor Q32 is connected to node 32. The gate of compare transistor Q31 is connected to the input $A_2$. The gate of compare transistor Q32 is connected to the input $B_2$ inverted by an inverter 60. Circuit pathway 58 has two compare transistors Q33 and Q34. The drain of compare transistor Q33 is connected to node 30. The source of compare transistor Q33 is connected to the drain of compare transistor Q34. The source of compare transistor Q34 is connected to node 32. The gate of compare transistor Q33 is connected to the input $A_3$ inverted by an inverter 62. The gate of compare transistor Q34 is connected to the input $B_3$.

Parallel circuit pathways 40, 42, 48, 50, 56 and 58 make-up tree 29 depicted in FIG. 3. As described above, the tree in a precharge device may decode any Boolean function as needed in a particular application.

In operation, the nth pair of parallel circuit pathways compares the nth bit of the two inputs $A_1$, $A_2$, and $A_3$ and $B_1$, $B_2$, and $B_3$ (n is an integer.). If the nth bit of each input differs from the other, then one of the two pathways will electrically short-circuit nodes 30 and 32 together. For instance, the second set of circuit pathways 48 and 50 compare bits $A_2$ and $B_2$. If both $A_2$ and $B_2$ are low or are both high then neither of the two circuit pathways will conduct. The output of comparator 38, therefore, will be high if every other input bit pair also match. If $A_2 = 1$ and $B_2 = 0$, then circuit pathway 48 will electrically short-circuit node 30 to node 32. If $A_2 = 0$ and $B_2 = 1$, then circuit pathway 50 will electrically short-circuit node 30 to node 32. In either of the latter two cases, comparator 38 will output a logic low.

Comparator 38 may be expanded to compare two inputs having more than three bits each. For each additional input bit, comparator 38 has an additional pair of parallel circuit pathways between nodes 30 and 32. Each of the circuit pathways has two compare transistors connected in series. The gates to the four compare transistors of each pair of parallel circuit pathways are cross-coupled to the input signals and their inverses. For instance, in the first circuit pathway of the nth pair of pathways, one gate is coupled to the nth input bit of the first input while the other gate is connected to the inverse of the nth input bit of the second input. Conversely in the second circuit pathway of the nth pair of pathways, one gate is connected to the inverse of the nth input bit of the first input while the other gate is connected to the nth input bit of the second input.

It is a first technical advantage of the disclosed invention that a set of input signals may be decoded dynamically. This allows the device to be used where speed and timing are critical.

It is a second technical advantage of the disclosed system that no other timing signals are necessary. This simplifies implementation, reduces the final size of a circuit incorporating the device, and reduces the response time of a circuit incorporating the disclosed invention.

It is a third technical advantage of the disclosed invention that it may be implemented with a NOR logic scheme. This allows the designer to decode a large number of inputs without reducing the performance of the decoder.

It is a fourth technical advantage of the disclosed invention that it is adaptable to identify any combination of inputs. The tree may be easily modified to trigger on any predetermined condition which may be represented in Boolean algebra.

It is a fifth technical advantage of the disclosed invention that it easily provides both a uni-transitional output and a uni-transitional inverse of the output, both to the active state.

It is a further technical advantage of the disclosed invention that it may be implemented with existing techniques. No new manufacturing methods or materials are required to practice the invention.

Although the present invention has been described with reference to a specific embodiment, further modifications and improvements will occur to those skilled in the art. For instance, the transistors in decoder 28 and comparator 38 may be implemented either as n-channel or p-channel devices as desired. These substitutions, and the requisite changes caused by them, will be obvious to one skilled in the art. It is to be understood therefore, that the invention encompasses all such modifications that do not depart from the spirit and scope of the invention as defined in the appended claims. Also, the designation of portions of the various transistors described above as "drain" or "source" is merely semantic given the bidirectional nature of CMOS circuits and is arbitrary given the other semiconductor media in which the disclosed invention may be practiced. These media include any material that provides three terminal switches such as gallium arsenide, Bipolar, ECL, NMOS and BiCMOS. The claims therefore will describe the drain, source, and gate generically as a first current electrode, a second current electrode and a control electrode, respectively.

What is claimed is:

1. A precharge device comprising:
   a first and a second node;
   a transistor tree operable to electrically short-circuit the first and second nodes together responsive to input signals;
   a screening transistor comprising a first and a second current electrode and a control electrode, the first current electrode coupled to a third node, the second current electrode coupled to the second node and the control electrode coupled to the first node; and
   clocking circuitry for precharging the first and third nodes to a first known voltage level during a first phase of a periodic clocking signal and for coupling the second node to a second known voltage level and evaluating the voltage on the first node to provide an output logic level during a second phase of the periodic clocking signal.

2. The precharge device of claim 1 wherein the transistor tree further comprises a plurality of pairs of parallel circuit pathways, one of each pathway of each pair of pathways operable to electrically short-circuit the first and second nodes together if corresponding bits of a first and a second input are not identical.

3. The precharge device of claim 1 wherein the transistor tree further comprises a plurality of decode transistors, each decode transistor comprising a control electrode, and a first and a second current electrode, each of the first current electrodes coupled to the first node, each of the second current electrodes coupled to the second node.

4. The precharge device of claim 1 further comprising:
   a first latching transistor comprising a first and a second current electrode and a control electrode, the first current electrode coupled to the first known voltage level, the second current electrode coupled to the first node and the control electrode coupled to the third node; and
   a second latching transistor comprising a first and a second control electrode and a control electrode, the first current electrode coupled to the first known voltage level, the second current electrode coupled to the third node and the control electrode coupled to the first node.

5. The precharge device of claim 4 wherein the clocking circuitry further comprises:
   a first clocking transistor comprising a first and a second current electrode and a control electrode, the first current electrode coupled to the first known voltage level, the second current electrode coupled to the first node and the control electrode coupled to the periodic clocking signal;
   a second clocking transistor comprising a first and a second current electrode and a control electrode, the first current electrode coupled to the first known voltage level, the second current electrode coupled to the third node and the control electrode coupled to the periodic clocking signal; and
   an evaluate transistor comprising a first and a second current electrode and a control electrode, the first current electrode coupled to the second node, the second current electrode coupled to the second known voltage level and the control electrode coupled to the periodic clocking signal.

6. The precharge device of claim 1 wherein the clocking circuitry further comprises:
   a first clocking transistor comprising a first and a second current electrode and a control electrode, the first current electrode coupled to the first known voltage level, the second current electrode coupled to the first node and the control electrode coupled to the periodic clocking signal;
   a second clocking transistor comprising a first and a second current electrode and a control electrode, the first current electrode coupled to the first known voltage level, the second current electrode coupled to the third node and the control electrode coupled to the periodic clocking signal; and an evaluate transistor comprising a first and a second current electrode and a control electrode, the first current electrode coupled to the second node, the second current electrode coupled to the second known voltage level and the control electrode coupled to the periodic clocking signal.

7. A precharge device comprising:

a first, a second and a third node;

a plurality of decode transistors, each decode transistor comprising a first and a second current electrode and a control electrode, the first current electrode of each decode transistor coupled to the first node, the second current electrode of the decode transistor coupled to the second node, each of the control electrodes of the decode transistors coupled to one of a plurality of input signals;

a screening transistor comprising a first and a second current electrode and a control electrode, the first current electrode coupled to the third node, the second current electrode coupled to the second node and the control electrode coupled to the first node; and clocking circuitry for precharging the first and third nodes to a first known voltage level during a first phase of a periodic clocking signal and for coupling the second node to a second known voltage level and evaluating the voltage at the first node to provide an output logic level during a second phase of the periodic clocking signal.

8. The precharge device of claim 7 further comprising:

a first latching transistor comprising a first and a second current electrode and a control electrode, the first current electrode coupled to the first known voltage level, the second current electrode coupled to the first node and the control electrode coupled to the third node; and a second latching transistor comprising a first and a second current electrode and a control electrode, the first current electrode coupled to the first known voltage level, the second current electrode coupled to the third node and the control electrode coupled to the first node.

9. The precharge device of claim 8 wherein the clocking circuitry further comprises:

a first clocking transistor comprising a first and a second current electrode and a control electrode, the first current electrode coupled to the first known voltage level, the second current electrode coupled to the first node and the control electrode coupled to the periodic clocking signal;

a second clocking transistor comprising a first and a second current electrode and a control electrode, the first current electrode coupled to the first known voltage level, the second current electrode coupled to the third node and the control electrode coupled to the periodic clocking signal; and an evaluate transistor comprising a first and a second current electrode and a control electrode, the first current electrode coupled to the second node, the second current electrode coupled to the second known voltage level and the control electrode coupled to the periodic clocking signal.

10. The precharge device of claim 7 wherein the clocking circuitry further comprises:

a first clocking transistor comprising a first and a second current electrode and a control electrode, the first current electrode coupled to the first known voltage level, the second current electrode coupled to the first node and the control electrode coupled to the periodic clocking signal;

a second clocking transistor comprising a first and a second current electrode and a control electrode, the first current electrode coupled to the first known voltage level, the second current electrode coupled to the third node and the control electrode coupled to the periodic clocking signal; and an evaluate transistor comprising a first and a second current electrode and a control electrode, the first current electrode coupled to the second node, the second current electrode coupled to the second known voltage level and the control electrode coupled to the periodic clocking signal.

11. A comparator for comparing corresponding bits of a first and a second input, the comparator comprising:

a first, a second and a third node;

a plurality of pairs of circuit pathways coupled in parallel between the first and second nodes, each of the plurality of pairs of circuit pathways comprising:

a first transistor comprising a first current electrode, a second current electrode, and a control electrode, the first current electrode coupled to the first node, the control electrode receiving an Nth bit of a first input, where N is an integer index;

a second transistor comprising a first current electrode, a second current electrode, and a control electrode, the first current electrode coupled to the second current electrode of the first transistor, the second current electrode coupled to the second node, the control electrode receiving a logical complement of an Nth bit of a second input;

a third transistor comprising a first current electrode, a second current electrode, and a control electrode, the first current electrode coupled to the first node, the control electrode receiving a logical complement of the Nth bit of the first input;

a fourth transistor comprising a first current electrode, a second current electrode and a control electrode, the first current electrode coupled to the second current electrode of the third transistor, the second current electrode coupled to the second node, the control electrode receiving an Nth bit of the second input;

a screening transistor comprising a first and a second current electrode and a control electrode, the first current electrode coupled to the third node, the second current electrode coupled to the second node and the control electrode coupled to the first node; and clocking circuitry for precharging the first and third nodes to a first known voltage level during a first phase of a periodic clocking signal and for coupling the second node to a second known voltage level and evaluating the voltage at the first node to provide an output logic level during a second phase of the periodic clocking signal.

12. The comparator of claim 11 further comprising:
- a first latching transistor comprising a first and a second current electrode and a control electrode, the first current electrode coupled to the first known voltage level, the second current electrode coupled to the first node and the control electrode coupled to the third node; and
- a second latching transistor comprising a first and a second current electrode and a control electrode, the first current electrode coupled to the first known voltage level, the second current electrode coupled to the third node and the control electrode coupled to the first node.

13. The comparator of claim 12 wherein the clocking circuitry further comprises:
- a first clocking transistor comprising a first and a second current electrode and a control electrode, the first current electrode coupled to the first known voltage level, the second current electrode coupled to the first node and the control electrode coupled to the periodic clocking signal;
- a second clocking transistor comprising a first and a second current electrode and a control electrode, the first current electrode coupled to the first known voltage level, the second current electrode coupled to the third node and the control electrode coupled to the periodic clocking signal; and
- an evaluate transistor comprising a first and a second current electrode and a control electrode, the first current electrode coupled to the second node, the second current electrode coupled to the second known voltage level and the control electrode coupled to the periodic clocking signal.

14. The comparator of claim 11 wherein the clocking circuitry further comprises:
- a first clocking transistor comprising a first and a second current electrode and a control electrode, the first current electrode coupled to the first known voltage level, the second current electrode coupled to the first node and the control electrode coupled to the periodic clocking signal;
- a second clocking transistor comprising a first and a second current electrode and a control electrode, the first current electrode coupled to the first known voltage level, the second current electrode coupled to the third node and the control electrode coupled to the periodic clocking signal; and
- an evaluate transistor comprising a first and a second current electrode and a control electrode, the first current electrode coupled to the second node, the second current electrode coupled to the second known voltage level and the control electrode coupled to the periodic clocking signal.

15. A method of decoding a plurality of inputs comprising the steps of:
- during a first time period, precharging a first and second node to a first known voltage, the first node coupled to a transistor tree, the tree operable to electrically short-circuit the first node and a third node responsive to input signals, the second node coupled to a first current electrode of a screening transistor, the screening transistor comprising a second current electrode and a control electrode, the control electrode of the screening transistor coupled to the first node and the second current electrode of the screening transistor coupled to the third node; and
- during a second time period, coupling the third node to a second known voltage level and evaluating the voltage on the first node to provide an output logic level.

* * * * *